Figure 1:
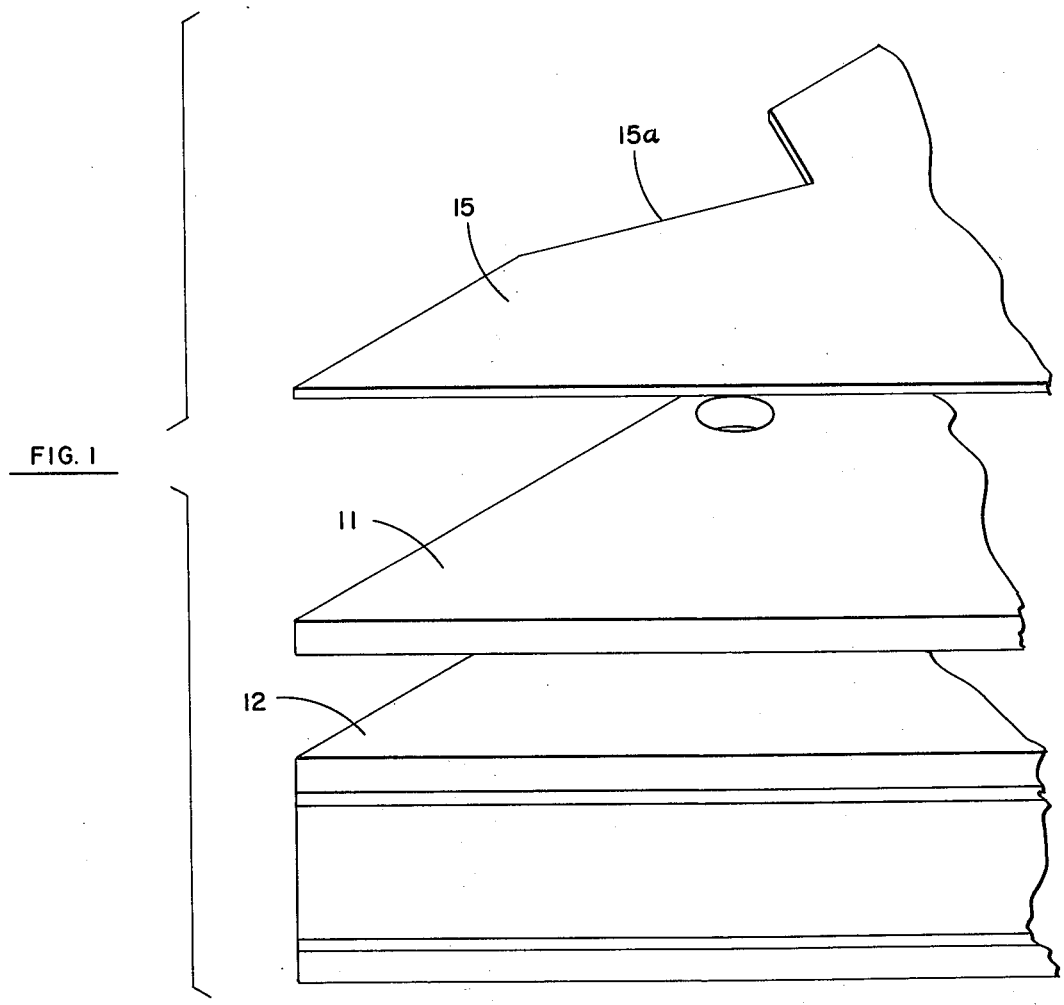

United States Patent [19]

Block

[11] 4,019,826
[45] * Apr. 26, 1977

[54] METHOD FOR DRILLING CIRCUIT BOARDS

[75] Inventor: James P. Block, Long Beach, Calif.

[73] Assignee: LCOA Laminating Company of America, Cerritos, Calif.

[ * ] Notice: The portion of the term of this patent subsequent to Oct. 24, 1989, has been disclaimed.

[22] Filed: June 18, 1973

[21] Appl. No.: 371,303

[52] U.S. Cl. .................................. 408/1 R; 408/3
[51] Int. Cl.² ........................................ B23B 35/00
[58] Field of Search ..................... 408/1, 3; 234/89

[56] References Cited
UNITED STATES PATENTS 3,700,341 10/1972 Block .................................. 408/1
3,718,404 2/1973 Grinnell et al. ................... 408/1 X Primary Examiner—Othell M. Simpson
Assistant Examiner—Z. R. Bilinsky
Attorney, Agent, or Firm—Edward A. Sokolski

[57] ABSTRACT

A metal foil, of a metal such as aluminum, is held in place over the drilling entry surface of a circuit board to be drilled. The drill thus first enters the foil which acts as a shield which takes burrs, pressure foot marks and particle marks which would otherwise be imparted to the surface of the circuit board. Further, the foil provides an even surface for the drill entry which tends to minimize drill wander and resultant hole mis-alignment which could occur if initial entry were to be made at the circuit board surface which is often uneven. After drilling has been completed, the foil is removed.

5 Claims, 2 Drawing Figures

METHOD FOR DRILLING CIRCUIT BOARDS

This invention relates to the fabrication of etched circuit boards, and more particularly to an improved method for drilling holes in such boards.

In the fabrication of printed circuit boards for use in electronics equipment, a great number of holes are drilled in the boards to accommodate component leads which pass through from one side of the board to the other. In the drilling of such boards by techniques of the prior art, it has been found that certain imperfections appear in the board surfaces which are intolerable, particularly in situations where these boards are to be used in precision applications. Firstly, a burr often appears where the drill enters the copper clad surface of the board. Such a burr or ridge around the drill hole is unacceptable in view of the fact that it forms a dam like condition when soldering or plating is attempted, often resulting in air entrapment which detracts from the quality of the soldering or plating. Burrs thus must be removed by a separate sanding operation which increases the time and cost involved in fabricating the boards. Secondly, machinery commonly used in the industry for drilling circuit boards uses a pressure foot for holding the workpiece in position during drilling which makes contact with the surface of the board prior to contact by the drill. It has been found that the pressure foot sometimes leaves marks or scratches around the drill hole area, making the board unacceptable. Further, in the drilling operation, particles sometimes fall from the drill onto the surface of the boards, and, with the contact on this surface of the pressure foot or a drill bushing, these particles are driven into the surface of the board, thus making the board unacceptable. Still another problem encountered with drilling techniques of the prior art is drill wander, when the drill strikes the surface of the board, resulting in a misalignment of the drilled hole. This is occasioned by virtue of the fact that the boards are generally fabricated from layers of woven fabric which gives the boards an uneven surface due to the cloth weave. Thus, when the point of the drill makes contact with a "high" point of the weave, it will slide off into the low areas. Even very small misalignments of this type can make a board unacceptable.

In my U.S. Pat. No. 3,700,341, issued Oct. 24, 1972, a technique involving the use of a specially prepared back-up board is described for preventing burrs from occurring at the drill exit surfaces. The back-up board of this prior patent utilizes a pressed fiber core which is sandwiched between metal foil outer layers. The present invention may be used in conjunction with my prior invention to prevent burrs and mars to the entry surfaces as well as the exit surfaces, and additionally to avoid drill wander, thus overcoming the aforementioned shortcomings of prior art techniques.

It is therefore an object of this invention to provide means for avoiding the burring or marring of the surface of a circuit board in the drilling thereof.

It is a further object of this invention to facilitate the precise alignment of drill holes in a circuit board.

It is still a further object of this invention to improve the efficiency of fabrication of circuit boards.

Figure 2:
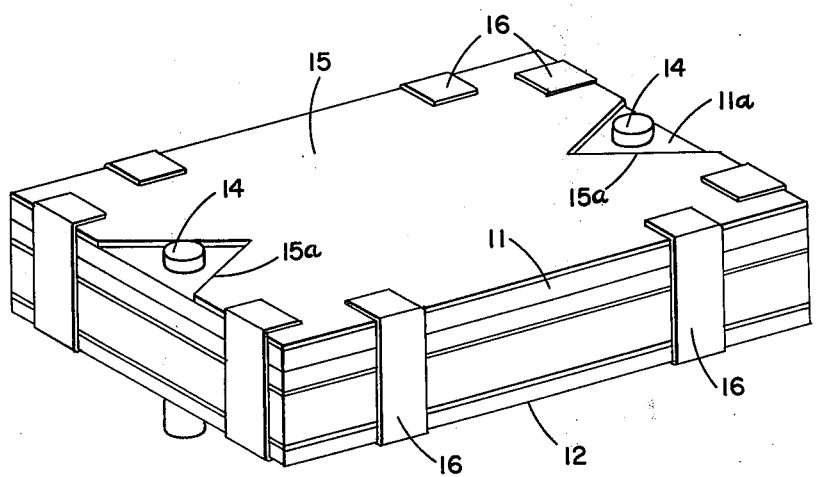

Other objects of this invention will become apparent as the description proceeds in connection with the accompanying drawings, of which:

FIG. 1 is an exploded view illustrating the steps involved in the technique of the invention; and FIG. 2 is a perspective view illustrating the drilling operation with the technique of the invention.

Briefly described, the technique of the invention involves the temporary setting in place over the drilling entry surface of a printed circuit board a metal foil such as of a suitable aluminum. With this metal foil set in place the drilling is then accomplished using the foil as the initial entry surface, whereby the foil takes any burrs, pressure foot marks and drilling chips. The foil thus serves as a shield which protects the entry surface of the board. Further, the foil provides a smooth even surface for the drill, thus avoiding drill wander which could occur if the drill were to make its initial entry on the surface of the board.

Referring now to the drawings, the technique of the invention is as follows: Circuit board 11 to be drilled is held against back-up board 12 which may be of the type of board described in my aforementioned Patent No. 3,700,341, by means of dowel pins 14. Entry foil 15 has notches 15a formed along opposite edges thereof to enable the foil to avoid dowel pins 14, and is removably held against the top surface 11a of the circuit board by means of strips of tape 16 which may be Scotch tape, masking tape or the like. Entry foil 15 is preferably of aluminum. A particular foil which has been found to provide ideal results is commercially available Type 3003-H19 Aluminum Foil which has a thickness of 0.005 inches, and has the following constituents added to pure aluminum:

Silicon 6%
Iron 7%
Copper 0.05–.20%
Manganese 1.0–1.5%
Zinc 0.10%

The aluminum sheet should be rectangular in cross section and can have a thickness of 0.002 – 0.249 inches. As thinner sheets of aluminum, i.e. about .005 inches, appear to provide fully satisfactory results and there appears to be no advantage to using sheets of a greater thickness, thinner sheets are to be preferred in the interests of economy. With the circuit board, back-up board and entry foil in place, as indicated in FIG. 2, the holes are drilled as desired. After the drilling operation has been completed, entry foil 15 is removed and discarded. While other metal foils might be used in certain instances, aluminum has been found to operate ideally.

The technique of this invention thus provides means for economically and efficiently preventing the marring of the top surface of a circuit board in drilling operations.

While the invention has been described and illustrated in detail, it is to be clearly understood that this is intended by way of illustration and example only and is not to be taken by way of limitation, the spirit and scope of this invention being limited only by the terms of the following claims.

I claim:

1. A technique for drilling holes in a circuit board comprising the steps of:
   placing the circuit board on a back-up board with one of the broad surfaces of the circuit board resting against a broad surface of the back-up board wherein said back-up board is formed of a pressed wood fibrous core having metal foil laminated to both sides thereof;
   placing a metal foil over the other surface of the circuit board;

placing retaining means on said foil and circuit board to temporarily retain the foil on the board;

drilling through the foil and the circuit board to the back-up board; and after the drilling has been completed, removing the metal foil from the circuit board surface.

2. The method of claim 1 wherein the foil is aluminum.

3. The method of claim 2 wherein the aluminum foil is rectangular in cross section and has a thickness of between 0.002 and 0.249 inches.

4. The method of claim 2 wherein the aluminum foil has a thickness of 0.005 inches.

5. The method of claim 2 wherein the aluminum foil is Type 3003-H19 Aluminum, having a thickness of 0.005 inches.

* * * * *